(12) United States Patent
DeAngelis et al.

(10) Patent No.: US 7,395,717 B2
(45) Date of Patent: Jul. 8, 2008

(54) FLEXIBLE CAPACITIVE SENSOR

(75) Inventors: Alfred R. DeAngelis, Spartanburg, SC (US); D. Bruce Wilson, Buffalo, SC (US); Brian A. Mazzeo, Davie, FL (US)

(73) Assignee: Milliken & Company, Spartanburg, SC (US)

( * ) Notice: Subject to any disclaimer, the term of this patent is extended or adjusted under 35 U.S.C. 154(b) by 280 days.

(21) Appl. No.: 11/351,735

(22) Filed: Feb. 10, 2006

(65) Prior Publication Data

US 2007/0248799 A1    Oct. 25, 2007

(51) Int. Cl.
*G01L 9/12*    (2006.01)
(52) U.S. Cl. .......................................... 73/728; 73/724
(58) Field of Classification Search ................. 73/718, 73/724, 756
See application file for complete search history.

(56) References Cited

U.S. PATENT DOCUMENTS

| | | | |
|---|---|---|---|
| 2,866,141 A | 12/1958 | Frank et al. | 317/246 |
| 3,544,733 A * | 12/1970 | Reylek et al. | 381/99 |
| 4,016,490 A | 4/1977 | Weckenmann et al. | 324/671 |
| 4,437,138 A | 3/1984 | Nicol | 361/283 |
| 4,476,463 A | 10/1984 | Ng et al. | 340/712 |
| 4,644,801 A | 2/1987 | Kustanovich | 73/862.04 |
| 4,680,430 A | 7/1987 | Yoshikawa et al. | 178/19 |
| 4,703,757 A | 11/1987 | Cohen | 600/480 |
| 4,827,763 A | 5/1989 | Bourland et al. | 73/172 |
| 4,852,443 A | 8/1989 | Duncan et al. | 84/1.04 |
| 5,033,291 A | 7/1991 | Podoloff et al. | 73/172 |
| 5,060,527 A | 10/1991 | Burgess | 73/862.68 |
| 5,365,461 A | 11/1994 | Stein et al. | 364/550 |
| 5,449,002 A | 9/1995 | Goldman | 600/592 |
| 5,554,835 A | 9/1996 | Newham | 200/85 |
| 5,565,658 A | 10/1996 | Gerpheide et al. | 178/19 |
| 5,608,599 A | 3/1997 | Goldman | 361/283.1 |
| 5,622,123 A | 4/1997 | Rajamannan | 111/120 |
| 5,623,760 A | 4/1997 | Newham | 29/622 |
| 5,775,332 A | 7/1998 | Goldman | 600/587 |
| 5,878,620 A | 3/1999 | Gilbert et al. | 73/172 |
| 5,917,180 A | 6/1999 | Reimer et al. | 250/227.14 |

(Continued)

FOREIGN PATENT DOCUMENTS

EP    1 211 633    6/2002

(Continued)

OTHER PUBLICATIONS

Patent Cooperation Treaty PCT International Search Report. Date of Mailing, Jul. 16, 2007. International Application No. PCT/US2007/003069.

*Primary Examiner*—Andre J Allen
(74) *Attorney, Agent, or Firm*—Terry T. Moyer; Cheryl J. Brickey (57) ABSTRACT

The invention relates to a flexible, resilient capacitive sensor suitable for large-scale manufacturing. The sensor comprises a dielectric, an electrically conductive layer on the first side of the dielectric layer, an electrically conductive layer on a second side of the dielectric layer, and a capacitance meter electrically connected to the two conductive layers to detect changes in capacitance upon application of a force to the detector. The conductive layers are configured to determine the position of the applied force. The sensor may be shielded to reduce the effects of outside interference.

13 Claims, 6 Drawing Sheets

U.S. PATENT DOCUMENTS

| | | | |
|---|---|---|---|
| 5,923,522 A | 7/1999 | Sajna | 361/288 |
| 6,033,370 A | 3/2000 | Reinbold et al. | 600/595 |
| 6,111,756 A * | 8/2000 | Moresco | 361/735 |
| 6,152,591 A | 11/2000 | McCall et al. | 700/231 |
| 6,210,771 B1 | 4/2001 | Post et al. | 428/100 |
| 6,291,568 B1 | 9/2001 | Lussey | 524/413 |
| 6,333,736 B1 | 12/2001 | Sandbach | 345/178 |
| 6,356,187 B2 | 3/2002 | Jinno et al. | 340/438 |
| 6,369,804 B1 | 4/2002 | Sandbach | 345/173 |
| 6,389,681 B1 | 5/2002 | Rock et al. | 29/611 |
| 6,431,005 B1 | 8/2002 | Delaye | 73/724 |
| 6,437,258 B1 | 8/2002 | Sandbach | 178/18.05 |
| 6,452,479 B1 | 9/2002 | Sandbach | 338/208 |
| 6,492,980 B2 | 12/2002 | Sandbach | 345/173 |
| 6,495,069 B1 | 12/2002 | Lussey et al. | 252/512 |
| 6,501,465 B2 | 12/2002 | Sandbach | 345/173 |
| 6,504,531 B1 | 1/2003 | Sandbach | 345/173 |
| 6,519,137 B1 | 2/2003 | Nitta et al. | 361/525 |
| 6,585,162 B2 | 7/2003 | Sandbach et al. | 235/462.44 |
| 6,639,162 B2 | 10/2003 | Sandbach et al. | 200/512 |
| 6,646,452 B2 | 11/2003 | Lester | 324/661 |
| 6,646,540 B1 | 11/2003 | Lussey | 338/47 |
| 6,714,117 B2 | 3/2004 | Sandbach | 338/101 |
| 6,807,689 B1 | 10/2004 | Royko et al. | 4/541.1 |
| 6,826,968 B2 | 12/2004 | Manaresi et al. | 73/862.046 |
| 6,999,301 B1 | 2/2006 | Sanftleben et al. | 361/312 |
| 7,071,889 B2 * | 7/2006 | McKinzie et al. | 343/756 |
| 2003/0071763 A1 * | 4/2003 | McKinzie et al. | 343/909 |
| 2003/0217582 A1 | 11/2003 | Reinbold et al. | 73/12.09 |
| 2006/0131159 A1 | 6/2006 | Kaps et al. | 200/600 |
| 2006/0198080 A1 | 9/2006 | Hawes et al. | 361/311 |
| 2006/0232559 A1 | 10/2006 | Chien et al. | 345/168 |

FOREIGN PATENT DOCUMENTS

| | | |
|---|---|---|
| EP | 1 447 653 | 8/2004 |
| EP | 1 605 240 | 12/2005 |
| FR | 2 163 814 | 7/1973 |
| SE | 525 016 | 11/2004 |
| WO | 98/22836 | 5/1998 |
| WO | 2005/067146 | 7/2005 |
| WO | 2005/108172 | 11/2005 |

* cited by examiner

FLEXIBLE CAPACITIVE SENSOR

TECHNICAL FIELD

This invention relates to a flexible capacitive sensor. More particularly, the invention relates to a capacitive sensor suitable for large-scale manufacturing, that is both physically flexible and flexible in its applications, and that senses incremental changes in pressure based on the changes in the capacitance of the sensor.

BACKGROUND

Sensors, as the term is used here, refer to systems that react to a change in the environment. Pressure sensors react to an applied force or pressure using a variety of physical principles. Optical sensors change their optical properties under applied force. Similarly, electrically resistive, or simply resistive, sensors have an electrical resistance that changes under applied force. Piezoresistive sensors measure the change in electrical resistance of a piezoresistive material as pressure is applied.

Capacitive sensors change capacitance. This can be in response to an applied force; it can also be in response to the proximity of an object with relatively large capacitance, such as a person. Capacitive sensors can also use a combination of resistive and capacitive sensing, in which the electrical resistance is measured when the capacitance changes.

Capacitive sensors are known and are used, for example, in touch screens and elevator buttons. The change in capacitance is typically based on one of two principles. The first approach involves changing the capacitance monitored by the sensing system through direct electrical contact with a large capacitive object, usually a person through their finger. In certain cases this type of sensor may also function to detect the proximity of an object to the touch sensor, not requiring physical contact with the touch sensor. Because these systems often require direct contact between the person and the sensing system they may not work if, for example the person is wearing a glove. Additionally, capacitive coupling may not be well suited to quantitatively measuring the applied pressure or proximity, but are capable of binary (on/off) sensing.

The second approach uses two conductive planes separated by a compressible, resilient dielectric. This composite forms a capacitor whose capacitance depends in part on the distance between the conductive planes. The compression of the dielectric under pressure changes the capacitance between the planes, which can be detected by the sensing system. By calibrating the compression with the applied force or pressure, this system can be used to quantify the force or pressure of the interaction with the sensor.

In recent years, there has growing interest in so-called "smart fabrics" that give electronic devices physical flexibility. They allow an electronic device to be incorporated into an existing fabric rather than have a separate electronic device. An example of a smart fabric is a computer keyboard that can be rolled up when not in use.

Flexible sensors are needed for smart fabrics and other applications that require flexibility. Flexible optical pressure sensors have been described, for example, in U.S. Pat. No. 4,703,757 to Cohen and U.S. Pat. No. 5,917,180 to Reimer & Danisch. Flexible sensors based on electrical contact of two or more conducting planes are available from Eleksen Ltd. of Iver Heath, United Kingdom. Flexible pressure sensors that use principles of piezoreistance are available from Softswitch Ltd. of likely, United Kingdom. A flexible capacitive sensor based on the capacitance of the human body is described in U.S. Pat. No. 6,210,771 to Post, et al. A flexible capacitive sensor that uses the change in spacing between conductive planes is described in a series of U.S. Patents to Goldman, et al. These patents teach the use of flexible conductive and dielectric layers, but they do not teach a system which can be used to determine location, nor do they teach systems with multiple sensors (beyond the simple case of replications of a single sensor). All patent documents referenced in this specification are hereby specifically incorporated by reference in their entirety as if fully set forth herein.

Thus there remains a need for a large-area flexible capacitive pressure sensor with good spatial resolution, capable of quantifying applied pressure or force. Here we address those issues by describing multiple methods of constructing a flexible capacitive sensing system with multiple sensors that detects the presence of an applied force or pressure and is capable of determining the magnitude and location of the applied force or pressure.

SUMMARY OF THE INVENTION

The present invention overcomes many of the deficiencies of capacitive touch sensors. The present invention provides an inexpensive, light weight, flexible, capacitive sensor and an efficient, low cost method of manufacturing. The present invention is a capacitive sensor suitable for large-scale manufacturing, that is both physically flexible and flexible in its applications, and that senses incremental pressure based on the changes in the capacitance of the sensor.

One advantage of the present invention is the manner in which the components, namely, the active layer, the dielectric layer, and the reference layer can be assembled to form the present capacitive sensor in a large-scale manufacturing process. Coating, gluing, and screen printing operations can be easily automated. Such operations can make a very large capacitive sensor array or a large fabric from which individual sensors or sensor arrays can be cut.

Another important feature of the present invention is compatibility with the use of penetration connectors for quickly and easily connecting traces and the reference plate to a capacitance meter (an electrical measurement system) so that electrical signals can be applied or measured from the present sensor without the need for customized electrical connections.

Still another feature of the present invention is the use of capacitance rather than resistance for sensing contact. Resistance typically requires the two conductive surfaces to touch; capacitance, in some embodiments not only does not require touching but does not even require physical contact with the sensor in some embodiments of the present invention, but mere proximity of a button with the user's finger. Capacitance may also be used to measure the pressure of contact and not just the fact of contact.

Yet another feature of the present invention is the ability to locate the position of an interaction. This can have several uses. It may allow one to further define the source of the interaction, such as determining the position of an occupant in a seat. It may also allow one to assign different functions to different areas of the sensor, so that a single sensor can be used, for example, to create a touch screen controlling a variety of functions.

These and other features and their advantages will be apparent to those skilled in the art of electrical circuits and capacitive circuits from a careful reading of the Detailed Description of Preferred Embodiments accompanied by the following drawings.

BRIEF DESCRIPTION OF THE DRAWINGS

The accompanying drawings which are incorporated in and which constitute a part of this specification illustrate several exemplary constructions and procedures in accordance with the present invention and, together with the general description of the invention given above and the detailed description set forth below, serve to explain the principles of the invention wherein.

To the extent possible, like elements are designated by like reference numbers throughout the various views.

DETAILED DESCRIPTION OF THE INVENTION

The flexible capacitive sensor experiences a change in capacitance upon the application of force sufficient to compress the sensor. The amount of applied force, up to a point, is related to the extent of the change in capacitance. In an alternate embodiment, the resistance is also measured to determine the location of user interaction on the sensor. A capacitance meter monitors the present flexible capacitive sensor to determine whether there has been a change in capacitance and the extent of that change.

Figure 1A:
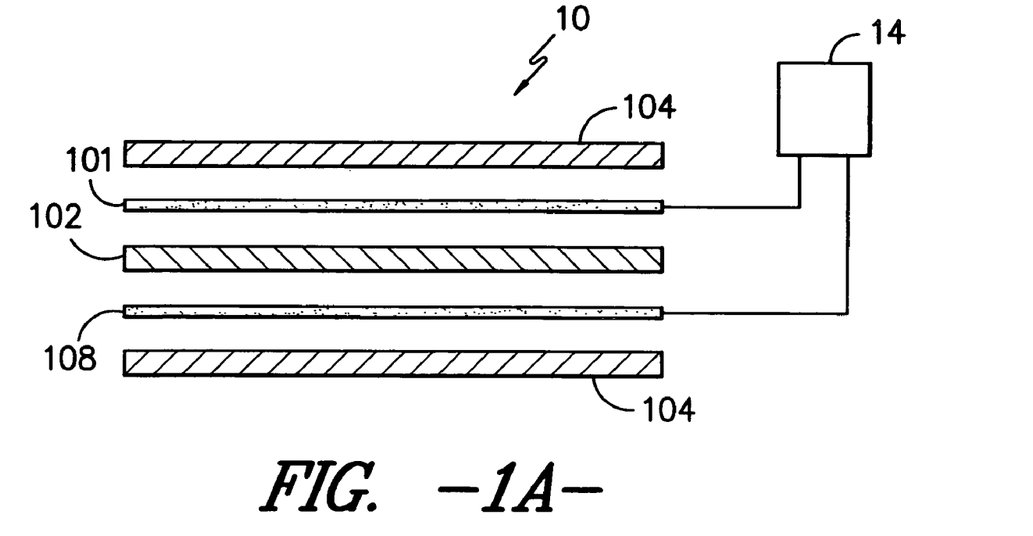
FIG. 1A is an illustrational schematic view of a capacitive sensor with an electrically conductive reference layer and an active layer connected to a capacitance meter, and a flexible, resilient dielectric layer Optional outer layers are also shown.

Referring now to FIG. 1A shows one embodiment of a capacitive pressure sensor 10 which generally includes a first conductive layer 101, a flexible, resilient dielectric layer 102, and a second conductive layer 108. The capacitive pressure sensor 10 may also include a protective layer 104 on one or both sides of the sensor 10. The first conductive layer 101 and the second conductive layer 108 are electrically connected to the capacitance meter 14.

In one embodiment of the invention, the flexible, resilient dielectric layer 102 is a thin, flexible, resilient film that has a thickness of less than 250 micrometers, preferably between 8 and 250 micrometers, and for some applications, between 8 and 50 micrometers. This thin film is essentially free of air voids, meaning that the film does not contain foam. The thin film may be a silicone film, such as 7 mil thick Duraflex PT9300 film available from Deerfield Urethane of South Deerfield, Mass. Compressibility enables the capacitance of sensor to be altered by an applied force. The dielectric thin film preferably compresses by 50% when a load of between 50 and 150 bars is applied. This range enables an acceptable signal to be read by the capacitance meter.

In another embodiment, the flexible, resilient dielectric layer 102 may be resilient and highly compressible closed or open cell foam. Some foamed materials include, but are not limited to, polyurethane foams, silicone, rubber. The dielectric foam preferably compresses by 50% when a load of between 0.5 and 1.0 bars is applied.

In another embodiment of the invention, the dielectric layer is a flexible, resilient spacer fabric. "Spacer fabric" as defined in this application is a fabric that has upper and lower ground layers separated by a gap that is supported by spacing yarns or fibers. The spacer fabric or other layers of fabric in the construction can be a woven, knitted, non-woven material, tufted materials, or the like. In some embodiments, the spacer fabrics is a double-needlebar knit, needled nonwoven fabric, or a hi-loft nonwoven fabric in which some of the fibers are purposefully oriented in the vertical direction. The textile may be flat or may exhibit a pile. In some embodiments, the spacer fabric can have a thickness of between 1 mm and 10 cm, preferably between 1 mm and 1 cm. Such textile materials can be formed of natural or synthetic fibers, such as polyester, nylon, wool, cotton, silk, polypropylene, rayon, lyocell, poly (lactide), acrylic, and the like, including textile materials containing mixtures and combinations of such natural and synthetic fibers. The spacer fabric preferably compresses by 50% when a load of between 0.07 and 1.4 bar is applied and compresses between 10 and 50% when a 0.14 bar load is applied. These ranges enable an acceptable signal to be read by the capacitance meter.

The electrical resistance across the flexible, resilient dielectric layer 102 (from one side of dielectric layer 102 to its opposing side) is preferably $10^9$ ohms or greater. The greater the dielectric constant of the flexible, resilient dielectric layer, the greater the capacitance of capacitive pressure sensor 10. This may allow the sensor to discriminate smaller signals, hence smaller applied forces, making the system more sensitive.

The conductive layers 101 and 108 may be made using a conductive coating on the flexible, resilient dielectric layer, an inherently conductive film or fabric, or an electrically conductive coating on a film or fabric. In some configurations conductive layers 101 and 108 are preferably continuous. In others, conductive layers 101 and 108 may contain separate and discrete conductive areas.

The conductive layers 101 and 108 may be formed by applying conductive coatings to the flexible, resilient dielectric layer 102 or a separate fabric or film that is applied to flexible, resilient dielectric layer 102 by laminating in any manner known to those skilled in the art. Preferably, an adhesive is used between the layers. These can include reactive urethane adhesives or low-melt polymeric materials. Adhesives can be applied for example by roto-gravure printing, knife coating, powder application, or as a web, depending on the form of the adhesive.

In one embodiment, the conductive layers 101 and 108 are made by an electrically conductive coating onto the flexible, resilient dielectric layer or on a film or fabric that is adhered to flexible, resilient dielectric layer 102. This enables the sensor to be thinner and weigh less, important for portable applications. This may also simplify assembly or reduce cost. The conductive ink may be applied through screen printing brushing, applying by roller, spraying, dipping, masking, vacuum plating, vacuum deposition or any other known means of applying ink. The conductive layers 101 and 108 are preferably formed by a printable conductive material, preferably a carbon-based ink, a silver-based ink, or combination of carbon-based and silver-based inks. The ink may be any conductive ink which is typically formed by blending resins or adhesives with powdered conductive materials such as, gold, silver, copper, graphite powder, carbon black, nickel or other metals or alloys. Graphite in an acrylic binder is a sufficiently electrically-conductive and cost-effective material for screen printing conductive layers 101 and 108.

In another embodiment, the conductive layers 101 and 108 are made by an inherently conductive film or fabric. Some inherently conductive films and fabrics include, for example, metallized fabrics, carbon-loaded olefin films fabrics coated with inherently conducting polymers, fabrics constructed from flexible, conductive yarns, or silver-coated yarns. Preferably, the film or fabric is adhered to the flexible, resilient dielectric layer preferably using a thermoplastic, thermoset, pressure sensitive or UV curable adhesive. Conductive layers 101 and 108 may be made of the same conductive materials or from any combination of the above materials. Combinations of materials can also be used within the same layer, if desired.

If the resistances of the conductive layers 101 and 108 are not being used to determine the position of the user interaction with the flexible capacitive pressure sensor 10, then the electrical resistance of the conductive layers 101 and 108 may be as low as practical. It is typically less than less than 10,000 ohms. If the resistance is being used to determine position, the resistance of conductive layers 101 and 108 will typically be much higher, though usually still less than 1 megaohm.

To monitor the change in capacitance in the capacitive sensors of FIGS. 2, 3A, 3B, 4A, 4B, 5, 6, and 7 a first voltage is applied to the first conductive layer 101 and a second voltage is applied to second conductive layer 108. In the case that there is more than one conductive area on the first conductive layer 101 and/or on the second conductive layer 108, then each area would get a separate voltage (ex. A third, fourth, fifth, etc. voltage). In the case where there is more than one area, preferably the voltages are applied to the areas sequentially. More preferably, the voltages are applied sequentially and are substantially equal. Preferably, the voltages applied to the first conductive layer 101 are at least 0.1 volts different than the voltages applied to the second conductive layer 108, more preferably 1 volt.

Figure 1B:
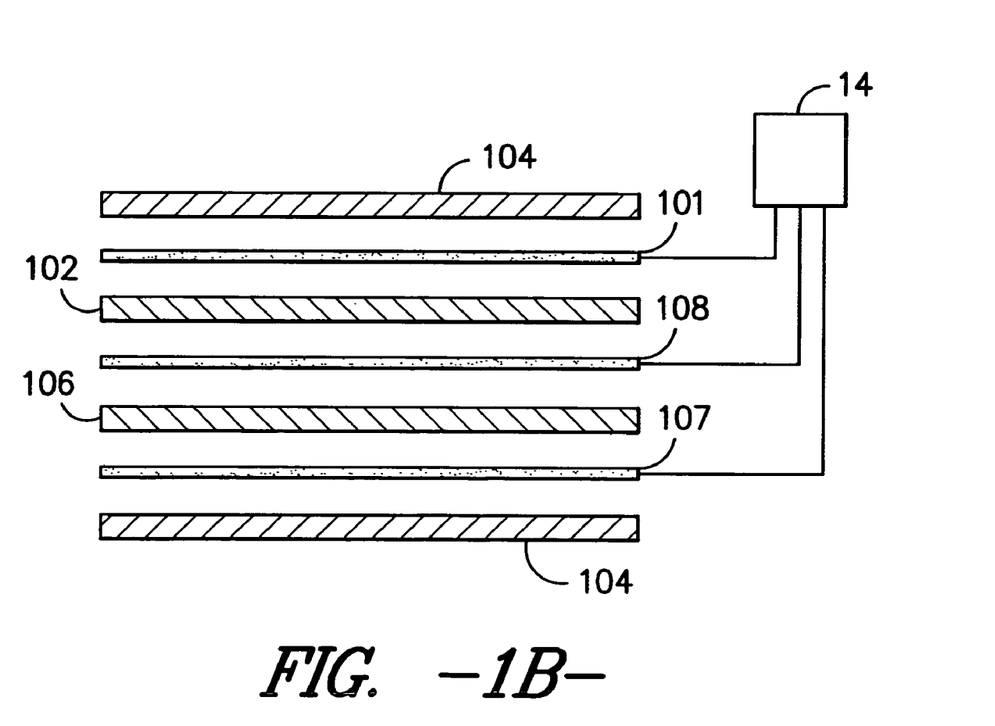
FIG. 1B is a schematic cross-section of a capacitive sensor with additional dielectric and reference layers.

There may be additional layers on the capacitive sensor, such as a second flexible, resilient dielectric layer 106 and a third conductive layer 107, as shown in FIG. 1B. Second flexible, resilient dielectric layer 106 is on second conductive layer 108 on the side opposite first dielectric layer 102. There is a third electrically conductive layer 107 adjacent to second dielectric layer 106 on the side opposite second conductive layer 108. Second dielectric layer 106 and the third conductive layer 107 create a capacitance between second conductive layer 108 and third conductive layer 107 that increases the total capacitance and hence sensitivity of sensor 10. Each of the conductive layers may have one or more conductive elements.

The materials used for the second flexible, resilient, dielectric layer 106 and the third electrically conductive 107 layer may be the same materials and have the same physical properties as the dielectric layer and conductive layers described previously. The capacitance meter 14 is connected to each conductive layer 101, 108, and 107. A first voltage is applied to the first conductive layer 101, a second voltage is applied to the second conductive layer 108, and a third voltage is applied to the third conductive layer 107 if one exists, where the first and second voltages have a difference of at least 0.1 volts and the second and third voltages have a difference of at least 0.1 volts. Preferably, the first and third voltages are equal. Preferably the first and third voltages form a reference voltage and are held constant during the operation of the capacitive sensor 10. In one embodiment, the reference voltage is held equal to earth ground or the ground of the sensor environment. This will serve to best isolate the capacitive sensor 10 from external interference and electrical discharges.

The first and third conductive layers 101 and 107 each form a separate capacitor with the second conductive layer 108. Preferably, the first and third voltages on each of the conductive layers 101 and 107 are equal so that the two separate capacitors are electrically parallel. This simplifies the requirements of the meter 14, which can treat the two separate capacitors as a single capacitor of larger capacitance. Larger capacitance will also typically improve the sensitivity of the sensor, which is one advantage of including conductive layers on both sides of the second conductive layer 108. First electrically conductive layer 101 and third electrically conductive layer 107 also help shield the capacitive sensor 10 from interference.

Sensor 10 can include further additions of another flexible, resilient dielectric layer and another conductive layer to further improve sensitivity. The number of such layers is usually limited by the additional cost, complexity, thickness, or stiffness that the additional layers impose.

In the case of sensor 10 built with a compressible dielectric, capacitance of the sensor varies inversely with the compression of flexible, resilient dielectric layer 102. A force applied to detector will compress the flexible, resilient dielectric layer 102 thus increasing the capacitance between first conductive layer 101 and second conductive layer 108. When the force is removed, or merely lessened, the separation distance between first conductive layer 101 and second conductive layer 108 increases and the capacitance of the capacitive sensor 10 decreases. The area over which the dielectric is compressed will be referred to as the "active area."

The flexible, resilient dielectric layer 102 is preferably a flexible, resilient layer or film. "Flexible", as related. to this invention, is defined to mean pliable and capable of being substantially bent through its thinnest dimension and returning to a flat configuration. Preferably, each element or layer in the sensor is flexible. "Resilient" is defined to mean a material that essentially returns to its initial thickness after each of multiple compressions, either over a portion of the material or its entirety. Dielectric, in this application, means a material that does not allow current to flow and supports an electric field under the presence of a potential difference. A "film" or "foam" is defined to be a flexible material that is essentially two dimensional in extent, that is, having a length in one dimension that is significantly smaller than its lengths in the other two dimensions. Foams include void spaces in a significant portion of their interior and are thus usually highly compressible. Films are defined to have few or no void spaces.

The resilience of the dielectric layer 102 is important for repeated use and durability. The flexibility is important so that the sensor may be used in applications that require flexibility, such as fitting around a molded dashboard, or on clothing as part of a smart fabric. Preferably, the flexible, resilient dielectric layer is capable of bending to a radius of curvature ranging from 20 millimeters (mm) to 5 mm, and more preferably to a range of 10 mm to 4 mm, and even more preferably to a range of 5 mm to 1 mm.

Figure 2:
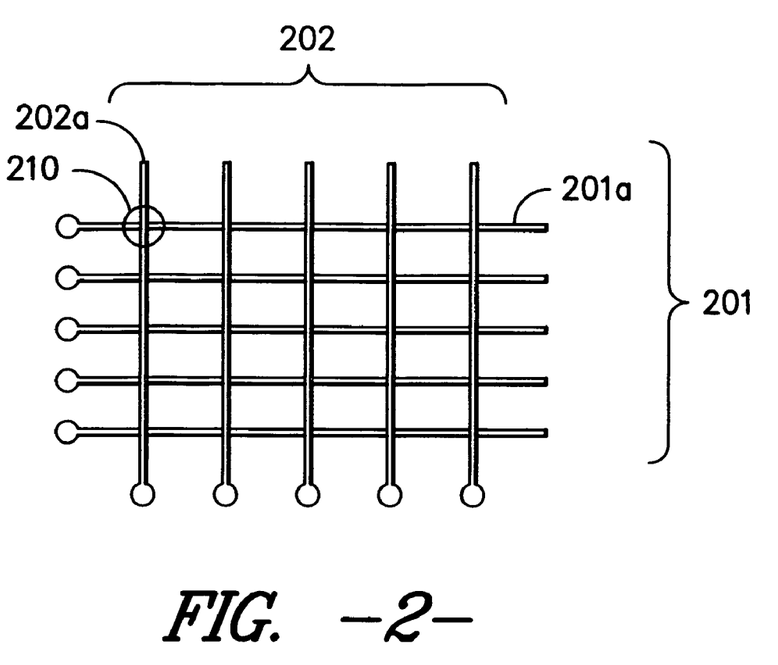
FIGS. 2 shows one embodiment of capacitive pressure sensor where the conductive elements form a grid configuration.

In FIG. 2, referred to from hereon as a "grid," each conductive layer can contain multiple conductive elements (also called active elements or areas) that are physically and electrically isolated from each other. First direction active elements 201 are conductive elements in one conductive layer, for example the first conductive layer 101, and second direction active elements 202 are conductive elements in a second conductive layer, for example the second conductive layer 108. The first direction active elements 201 and the second direction active elements 202 are in different directions and thus cross over each other. The active elements 201 and 202 on each conductive layer are spatially and electrically separated from each other. The areas outside the active elements 201 and 202 in the plane of the conductive layers 101 and 108 are not conductive. The elements in one conductive layer overlap elements in the other conductive layer, but they are electrically separated by the flexible, resilient dielectric layer 102 (not shown in FIG. 2). One region of overlap between the elements 201 and 202 is shown, for example, as active area 210. Additional active areas can occur wherever a first direction element 201 overlaps a second direction element 202. Active area 210 is defined by the overlap of the active element 201a with the active element 202a. Each of the elements 201 and 202 can be straight or curved and has a separate electrical connection to meter 14.

In FIG. 2 first direction active elements 201 are perpendicular to second direction active elements 202. While this is typical, in practice the elements can be in any configuration so long as there are regions of overlap and the elements in a given layer are physically and electrically separated. Preferably, first direction active elements 201 and second direction active elements 202 cross each other at an angle between 5 degrees and 175 degrees. In one embodiment, the first direction elements cross the second direction elements at 90 degrees.

Meter 14 has separate connections to each first direction element 201 and each second direction element 202. A voltage can be applied sequentially to each first direction element 201 and each second direction element 202. When a force is applied at an active area, the location of the active area can be determined by which connections to meter 14 are associated with a change in capacitance. For example, if a force is applied to active area 210, then the capacitance between first direction element 201a and second direction element 202a will decrease. This decrease can be detected by meter 14. The force applied at active area 210 will not affect the capacitance between any other pair of first direction active elements 201 and second direction active elements 202; therefore, the force can be associated with a specific active area 210.

Preferably, first direction active elements 201 cover at least 80% of the conductive layer 101 and second direction active elements 202 cover at least 80% of the other conductive layer 108 to provide a large total active area. Typically, first direction active elements 201 and second direction active elements 202 have an aspect ratio of greater than 5:1 and preferably, the physical separation of elements located on the same conductive layer is at least 1 millimeter.

The grid of FIG. 2 can be made using three conductive layers, as shown in FIG. 1B and described above. In this case, first conductive layer 101 contains first direction active elements 201 containing at least first and second conductive elements, and third conductive layer 107 contains second direction active elements 202 containing at least fourth and fifth conductive elements. Second conductive layer 108 is a continuous conductive area (the third conductive element) that overlaps all the active areas of the grid. Capacitance is measured between first conductive layer 101 and second conductive layer 108 as well as between third conductive layer 107 and second conductive layer 108.

Figure 3A:
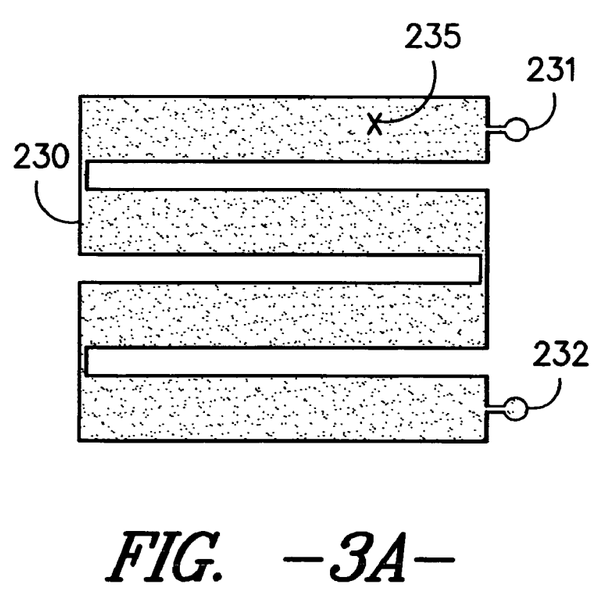
FIG. 3A shows one embodiment of capacitive pressure sensor where the conductive elements form a serpentine strip configuration.
Figure 3B:
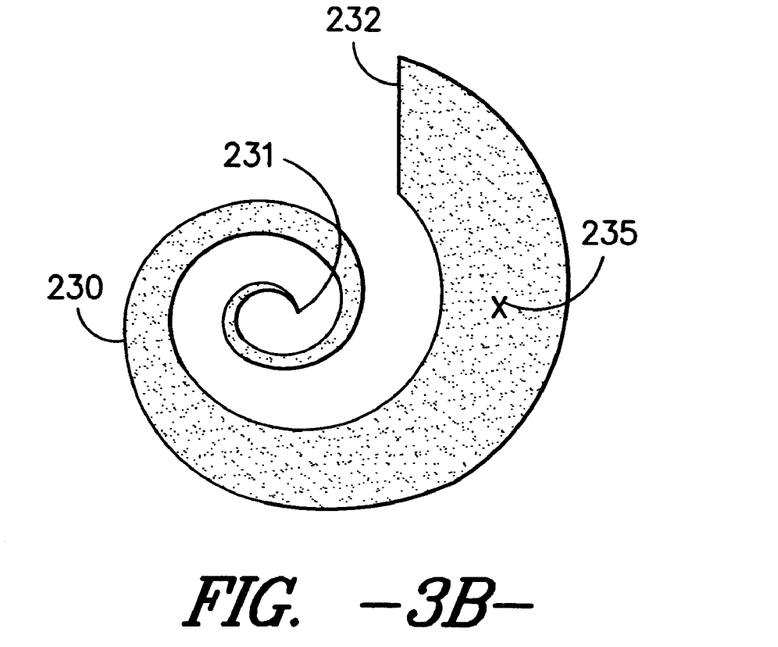
FIG. 3B shows one embodiment of capacitive pressure sensor where the conductive elements form a spiral configuration.

FIG. 3A shows a configuration that will be referred to as a "serpentine strip." In this embodiment, the conductive layer is configured as a single active element 230 that winds over the conductive layer. In the configuration of FIG. 3A, the active element 230 is a back and forth winding of parallel lengths. Another example is shown In FIG. 3B, in which active element 230 is in the form of a spiral. In practice, any configuration that covers all of the desired active areas is acceptable. Assuming the serpentine strip is on the first conductive layer 101, the second conductive layer 108 can be continuous and should overlap active element 230 at least at every desired active area. The roles of each conductive layer can be reversed. That is, first conductive layer 101 can be continuous while second conductive layer 108 can be formed in the configuration of the ladder or strip. This may be advantageous for isolating the sensor 10 from outside electromagnetic interference.

Determining the location of the applied force using a serpentine strip is done by determining the resistance from the applied force, for example applied force 235, to connection 231 through meter 14. Connection 232 can optionally be used to improve location of the applied force. In this case one uses the resistances, for example, from force 235 to connection 231 and from force 235 to connection 232 to determine the point of user interaction.

Figure 4A:
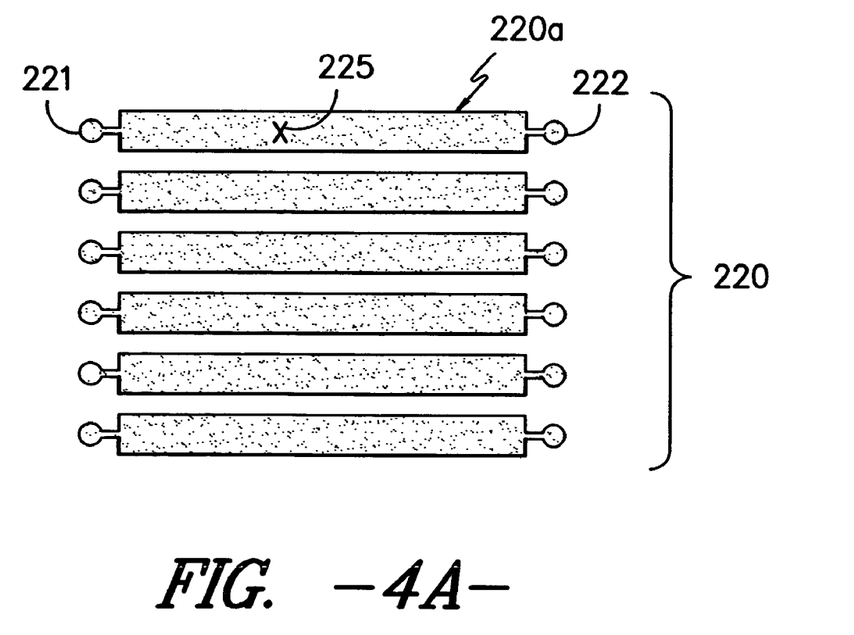
FIG. 4A shows one embodiment of capacitive pressure sensor where the conductive elements form a ladder configuration.

Another embodiment, shown in FIG. 4A and referred to from hereon as a "ladder," consists of a series of non-intersecting active elements 220 all contained in the same conductive layer, for example, first conductive layer 101. Active elements 220 are shown as uniform and parallel. However, while this arrangement is the simplest in concept, the lines need not be uniform or parallel, but they must be electrically isolated from one another. The other conductive layer, for example, second conductive layer 108, should substantially overlap each element 220, but it need not contain separate areas and can be continuous. Meter 14 has separate connections to each element 220 and another to the second conductive layer 108.

For purposes of discussion, we define the location along active elements 220 the "parallel" location, and the location orthogonal to this we will call the "perpendicular" location. A voltage can be applied sequentially to each active element 220, and the capacitance between each element 220 and the other conductive layer can be monitored by the resistance meter 14. Application of a force on one of the elements (active element 220a, marked with an "X" 225 at the point of applied force on the active element) will change the capacitance between that element and the second conductive layer 108. The change in capacitance can be associated with the particular element 220a on which the force was applied, providing information about the perpendicular location of the applied force that created the change in capacitance. For example, application of force 225 will change the capacitance of the first active element 220a, which can be detected by meter 14 through connection 222 or connection 221.

To determine the parallel location of the interaction 225 along active element 220a, second connections (shown on active element 220a as 221) can also be made from each element to meter 14. Using connections 221 and 222, resistance can be used to determine the distance from the applied force 225 to the each end of active element 220a. If the length of active element 220a is known, this provides two measurements of the parallel location of the applied force, reducing uncertainty in the value. Combined with the perpendicular location, this locates the applied force definitively in the plane of sensor 10.

Figure 4B:
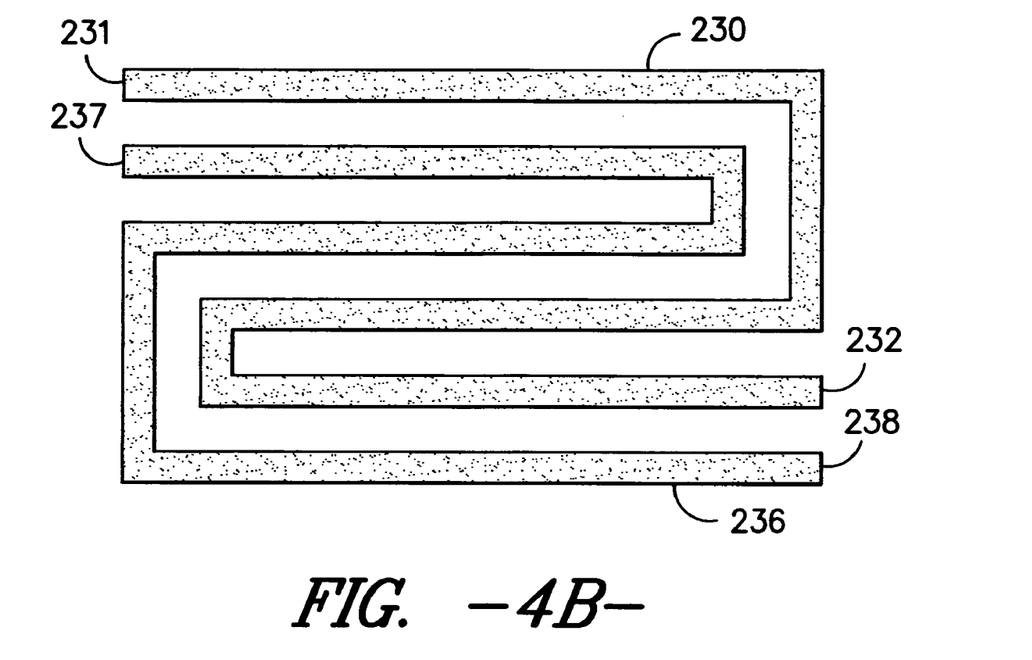
FIG. 4B shows one embodiment of capacitive pressure sensor where the conductive elements form a nested serpentine strip configuration.

In another embodiment of the invention, a nested serpentine strip configuration is used as shown in FIG. 4B. In this configuration, the conductive layer contains a first serpentine active element 230 and a second serpentine active element 236. Separate connections to meter 14 are made to the first serpentine active element 230 at connections 231 and 232, and to the second serpentine active element 236 at connections 237 and 238. Hence, the nested serpentine strip can have fewer connections than an equivalent ladder but greater sensitivity than an equivalent single serpentine strip. Although FIG. 4B shows only two nested serpentine active elements, there can be as many as desired. Each nested serpentine active element can be of any shape and need not be the same shape as the other nested serpentine active elements, so long as they are all physically and electrically separate from each other.

The ladder of FIG. 4A, the serpentine strip of FIG. 3A, and the nested serpentine strip of FIG. 4B can each be made using three conductive layers, as shown in FIG. 1B and described above. In this case, first conductive layer 101 and third conductive layer 107 contain the active conductive elements. Second conductive layer 108 is a continuous conductive area that overlaps all the active areas of the active elements. Capacitance is measured between first conductive layer 101 and second conductive layer 108 as well as between third conductive layer 107 and second conductive layer 108. The active conductive elements in conductive layer 101 can be identical and in registration to the active conductive elements in conductive layer 107, that is, they can completely overlap, in which case the three-layer construction increases sensitivity of sensor 10 as described above.

Alternatively, this arrangement can be reversed. First conductive layer 101 and third conductive layer 107 can be continuous conductive areas that overlap all the active conductive elements, which are contained in second conductive layer 108.

Figure 5:
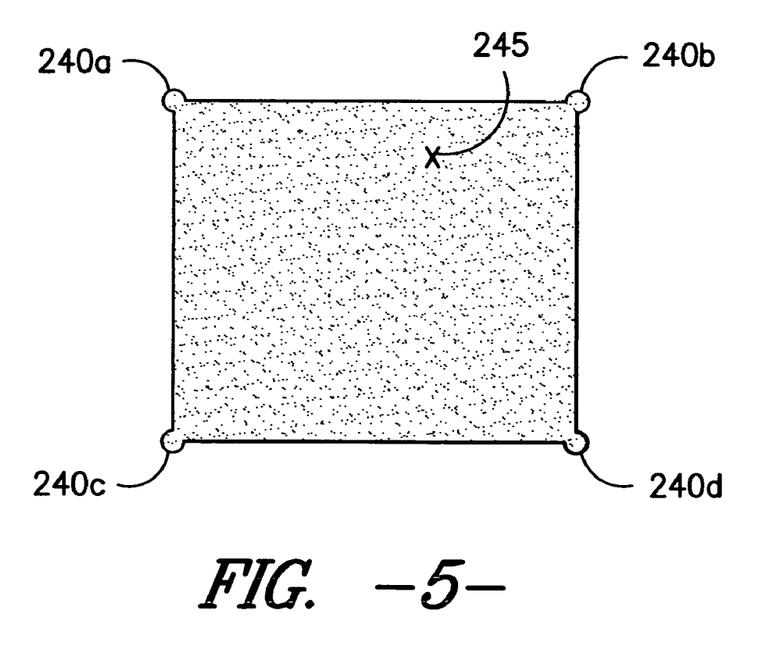
FIG. 5 shows one embodiment of capacitive pressure sensor where the conductive elements form conductive planes for triangulation.

Another method for determining location of the applied force is through triangulation. A sensor using triangulation is shown in FIG. 5. In this configuration, both first and second conductive layers 101 and 108 include large conductive areas that overlap each other. At least one of the sheets has at least three widely spaced connections 240 to meter 14. FIG. 5 shows a particular example with four connections 240 (labeled 240a, 240b, 240c, and 240d). Separate measurements are made using each of the connections 240(*a-d*). In each measurement, meter 14 is used to determine the resistance between the connection and applied force 245. The resistances are then compared, allowing a determination of the location of the applied force. Preferably, the capacitance meter determines position in at least 2 directions, fully determining the location of the applied force in the plane of the sensor.

Note that sensitivity of the sensor 10, which is related to the relative change in capacitance, will increase as the ratio of the active area to the total conductive area increases. The conductive area is defined as the area of first conductive layer 101 or second conductive layer 108 to which a monitoring voltage has been applied. The change in capacitance can be monitored by the meter 14, which can subsequently initiate a desired response, such as activation of an electrical device such as a radio.

Figure 6:
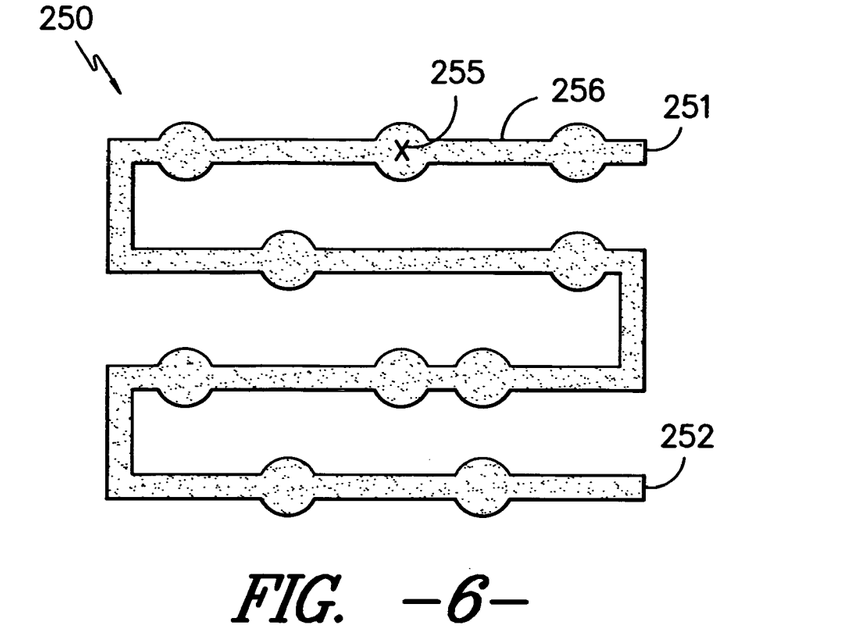
FIG. 6 is a schematic of a serpentine strip with varying width.
Figure 7:
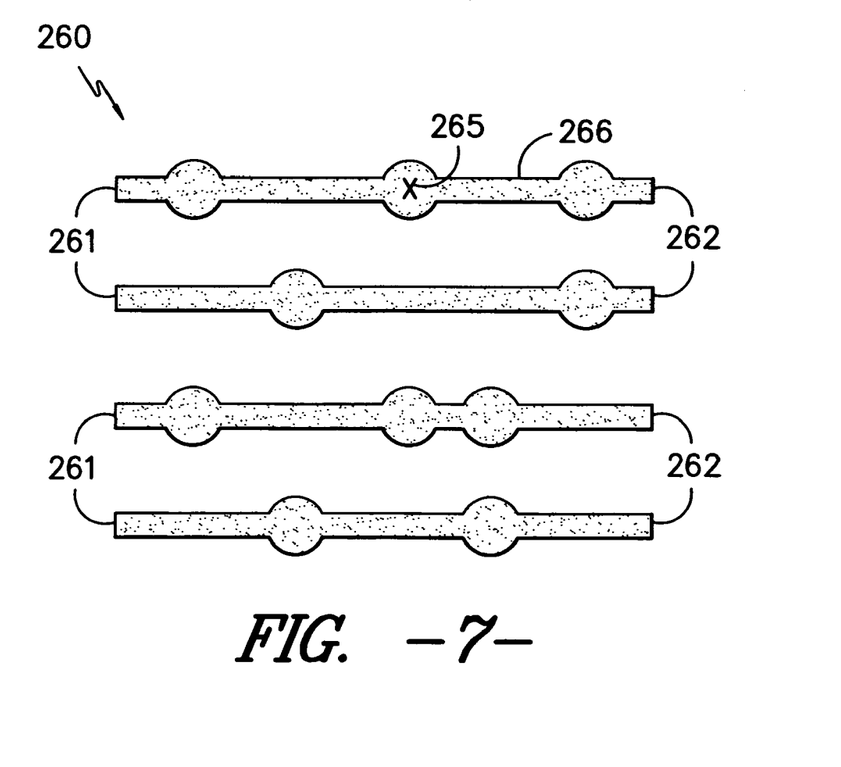
FIG. 7 is a schematic of a ladder where the elements have areas of different widths.

FIG. 6 shows a method of increasing sensitivity of the serpentine strip further by increasing the percentage of the total conductive area that is active area. This is achieved by varying the width of the conductive element over the length of the element. The active areas 255—where there are areas of user interaction—can be made as larger conductive regions connected by thin conductive strips, such as connecting strip 256. Patterned conductive coatings can be particularly effective for creating such conductive layers. Note that the active areas do not need to be evenly spaced along serpentine strip 250, nor do they need to be uniformly sized. Connections to meter 14 are made at ends 251 and 252. Although serpentine strip 250 is shown as a winding of parallel connecting strips 256, it should be obvious that any configuration which covers all of the desired active areas is acceptable. This principle can also be used in the ladder configuration. An example of this is shown in FIG. 7. The user interaction area 255 of ladder 260 is connected to ends 261 and 262 via a connecting strip 266.

Use of a serpentine strip over a ladder is a trade-off between simplicity and sensitivity. The serpentine strip is simpler, having only two connections to meter 14 and needing only one or two measurements to detect and locate an applied force. The ladder will provide greater sensitivity over a similar region of sensor 10. By dividing the conductive layer into multiple conductive elements as in a ladder, the area of any one conductive element is reduced. This increases the fraction of the conductive element covered by the applied force, increasing the sensitivity as described above.

At the edge of the flexible, resilient dielectric layer 102, a penetration connector (not shown) is used to make electrical contact with the conductive layers 101 and 108. The principle of operation of penetration connectors is well known in electronics. When making electrical connection with electrical conductors coated with insulation, penetration connectors are used to "bite" through the insulation to the conductor inside. Penetration connector will have teeth, which are applied to the conductive layers 101 and 108, and potentially to the third conductive layer 107 if one exists. In another embodiment of the present invention having a plurality of conductive areas in the conductive layer(s) 101, 108 and/or 107, separate teeth in the connector can contact each of the separate areas so that the meter 14 can be used to sense changes in capacitances as pressure is applied to each area or multiple areas. The use of penetration connector simplifies manufacture on a large scale.

The penetration connector allows connection of the present flexible capacitive sensor 10 to the capacitance meter 14 via a connector between the meter 14 and the conductive layers 101, 107 and 108. The capacitance meter 14 measures the voltage across flexible, resilient dielectric layer 102 and compares that voltage to a reference voltage. If the capacitance across dielectric layer 102 changes, such as if pressure is applied to capacitive sensor 10, the voltage across dielectric layer 102 also changes. The voltage output signal generated is based on the changing difference between the reference voltage and the nominal voltage across flexible, resilient dielectric layer 102. As the force applied to capacitive sensor 10 is reduced and dielectric layer 102 expands to its original dimensions, capacitance decreases and the process reverses.

The capacitance of detectors in this arrangement can be measured by a variety of electrical methods, two of which will be discussed here. The electrical measurements make use of the fact that the resistance of the conductive layers does not change, only the capacitance of individual detectors. Thus the measurable RC time constant characteristic of each event changes only due to changes in capacitance of the detector. One method is a voltage shift method; the other is a phase shift in the frequency response.

In the first method, which we will refer to as the voltage shift method, we use a series resistor connected to the trace. The capacitance meter 14 looks for any one of the following:

(1) the time to obtain a set decline in the voltage of the trace and detector during discharge of sensor 10; (2) the decline in the voltage of the trace and detector during a set time from the beginning of the discharge of sensor 10; (3) the time to obtain a set increase in the voltage of the trace and detector during the charging of sensor 10; or (4) the increase in the voltage of the trace and detector during a set time from the beginning of the charge of sensor 10. Any one of these four quantities allows determination of the RC time constant, and hence a measurement of the change in capacitance of the detector.

In the phase shift method, a time-varying voltage signal is applied to the active layer. A resistor to ground is connected to the reference layer. The resistor is used to measure the phase shift between the applied signal and the lagging signal through the active layer. As the lag is caused by the presence of capacitance in the active layer, a change in the lag can be used to determine the change in capacitance. The amplitudes of the original and lagging signal can also be compared to yield more information about the state of the system.

As is known in the art, common forms of the voltage signal include impulses, sine waves, and square waves. Often, alternating voltage signals will have a frequency greater than 10 kHz.

Methods to determine the location of an applied force may depend on determining the resistance of the conductive layer between the applied force and the connection between meter 14 and the conductive layer. When a voltage $V_0$ is applied across a capacitor (in this case, the two conductive layers 101 and 108), the voltage across the capacitor changes slowly. The rate of change is determined by the time constant RC, where C is the capacitance and R is the resistance of the circuit. Specifically, the voltage will change by a factor of e every RC seconds, where e is Euler's constant, approximately, 2.718.

If the conductive layer has a finite resistance, the circuit resistance R will include the resistance from that portion of the conductive layer between the applied force and the connection to meter 14. For example, consider FIG. 8A, a schematic electronic representation of a sensor. Conductive layers 401 and 408 are separated by a flexible, resilient dielectric layer (not shown). Applied force 410 changes the capacitance C at the point of application. This change is detected by meter 14 through connections 411, 412, 413, and, 414.

Figure 8A:
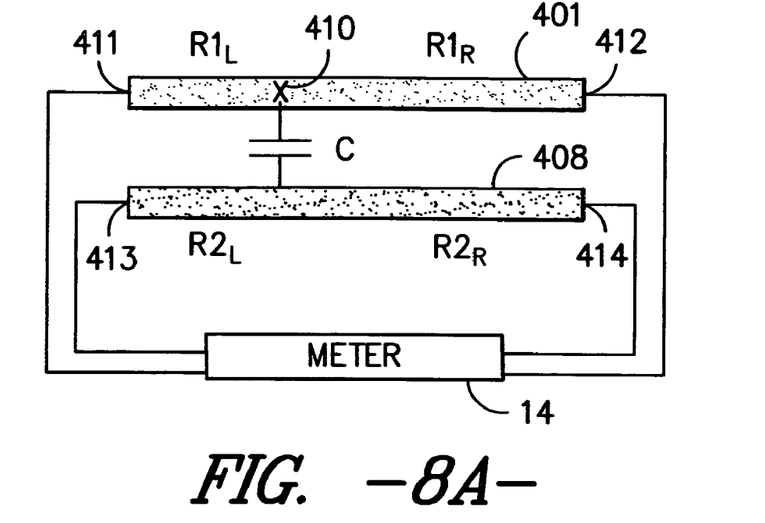
FIG. 8A is a schematic identifying the electrical quantities of the flexible sensor used to determine the location of a user interaction.

On conductive layer 401 the resistance between applied force 410 and connection 411 is $R1_L$. Similarly, the resistance between applied force 410 and connection 412 is $R1_R$. On conductive layer 408, the resistance between applied force 410 and connection 413 is $R2_L$, and the resistance between applied force 410 and connection 414 is $R2_R$. The lines from the connection to meter 14 represent wires of negligible resistance. Depending on which connections are used, the complete circuit can have one of four different total circuit resistances: $R_1=(R1_L+R2^L)$, $R_2=(R1_L+R2_R)$, $R_3=(R1_R+R2_L)$, This is a system of four equations for the four unknown resistances $R1_L$, $R1_R$, $R2_L$, and $R2_R$, which can thus be determined uniquely. Assuming a known relationship between the resistance along a conductive layer and the distance along that layer, that is, between a determined resistance and the distance from applied force 410 to the connection point, each resistance provides a measure of the location of applied force 410.

Figure 8B:
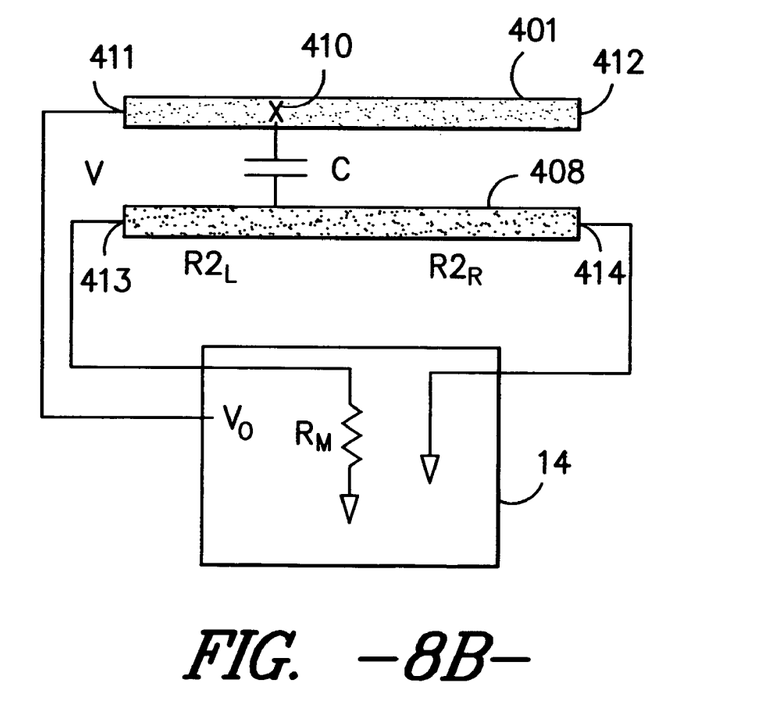
FIG. 8B is a schematic identifying the electrical quantities of the flexible sensor and the capacitance meter used to determine the location of a user interaction.

Note that each conductive layer provides two measurements of the location of applied force 410. Thus, only one conductive layer of finite resistance is necessary to use this method to locate applied force 410 and the second layer may have very low (negligible) resistance. Providing both layers with finite resistance increases the over-determination of the location. Behavior of the sensor in FIG. 8A can be better understood by examining the electrical schematic in FIG. 8B showing a simplified sensor by assuming conductive layer 401 is highly conductive and contributes negligible resistance to the circuit. Also, meter 14 has been expanded to show its state when measuring resistance $R2_L$. Specifically, connection 414 is set to ground, while voltage $V_0$ is applied to connection 411.

As is typical, the meter has high input impedance. That is, $R_M$ is much larger than the other resistances in the circuit. In that case, standard circuit analysis shows that the voltage V at connection 413 is related to the applied voltage $V_0$ by $V=V_0/(1+1/(w*C*R2_R^2))$, where w is the frequency of the applied voltage $V_0$. Ideally, for sensor 10 to have maximum sensitivity to changes in the location of applied force 410, the voltage V will have maximum sensitivity to the value of $R2_R$, which is the only quantity in the equation for V that depends on the location of applied force 410. Further analysis of this equation shows that for w small, V is not sensitive to $R2_R$ for small values of $R2_R$, that is, on the right side of conductive layer 408. Similarly, for high frequencies w and small values of $R2_L+R2_R$, V is not sensitive to $R2_R$ except for small and large values of $R2_R$, that is, sensitivity is low in the center of conductive layer 408. Therefore, to ensure good sensitivity everywhere on conductive layer 408, it is preferable to apply voltage with moderately large frequencies and build conductive layer 408 from materials of finite resistance.

Although this analysis was done for the simplified case of only one conductive layer of finite resistance, the conclusions also hold for the more general case shown in FIG. 8A where both conductive layers have finite resistance. It is also valid if using additional conductive and flexible, resilient dielectric layers, as shown in FIG. 1B.

Conductive layers of finite resistance will typically have a resistance between connection points of 10-1,000,000 ohms, preferably 100-100,000 ohms, more preferably 1,000-10,000 ohms. The method of using resistance to determine position can be practiced in conjunction with the ladder, the serpentine strip, triangulation, or other configurations. In the case where the conductive area is a strip, as in the ladder or serpentine strip, resistances to the right and left can be further differentiated by changing the width of the strip in a known fashion as shown, for example, in FIG. 3B.

The digital information, the decay time constant or the phase shift, represents the continuous time variation of the resistive-capacitive properties of the network and, as such, the conditions of sensor 10. To achieve a better signal-to-noise ratio, averaging and filtering may be applied to the continuous data stream.

The time constant method and the phase shifts are prone to electromagnetic interference as well as stray capacitance. Thus, the noise content of the signals can obscure true conditions. Sampling is performed intervals defined by settable interrupts in microcontroller. Through sampling dictated by the Nyquist criterion, which governs sampling theory and digital reconstruction of high-frequency events, events happening at less than half the sampling frequency can be successfully captured. At the time of individual sampling, multiple samples on the order of a few microseconds each are averaged together to reduce the error introduced by the analog-to-digital converter as well as small electromagnetic effects. Sampling may occur at regular time intervals, or it may be advantageous to sample at random intervals so that the noise spectrum is not well correlated with the sampling interval.

The sampled data are then passed into either finite impulse response filters or infinite impulse response filters. These filters further reduce the effects of noise and interference on the sampled data from sources such as power lines. In this manner, a better estimate of the capacitance of the detector can be determined through a better estimate of the phase shift or time constant.

Cascading different filters permits different interpretations of the data. For example, a set of filters is used to remove or ignore long term changes to the system (e.g., gradual loss of resilience in the flexible, resilient dielectric layer 102), thus providing a stable baseline, while other filters isolate the short term changes (i.e., pressing sensor 10). The selection of different filters is a significant improvement over simple sampling and comparison to a threshold.

The capacitive sensor 10 typically requires calibration. Calibration is needed because baseline capacitance tends to drift over time because of environmental changes, material changes, and external electromagnetic fields. Particularly in dielectric materials made of foam, notwithstanding the use of foams with minimized creep and hysteresis, capacitance nonetheless will change in time. A sensor that can be recalibrated will always be more robust and sensitive than one that cannot be.

There are three ways to calibrate sensor 10. The first way is to program calibration settings at the time of manufacture. A second method is to calibrate sensor 10 every time the system of which it is a part initializes itself, that is, upon start up and it effectively reduces errors for some variations on large time scales. In third method, sensor 10 is continuously calibrated for changing conditions by filtering out extraneous electrical noise as well as disregarding the inadvertent touch or other contact. There are commercially available electronic modules that are designed to sense capacitance and that incorporate continuous self-calibration, noise filtering and recalibration.

Sensor 10 may include additional insulating layer(s) 104, also referred to as cover layers. These layers do not contribute to the electrical properties of sensor 10 in any significant way. Functions of the exterior layer(s) may include visual or tactile aesthetics, protection, and acting as a user interface. There can be none, one, or multiple such layers. Multiple layers can be made of different materials to provide different functions, as described below. Preferably, the cover layer is fabric. The fabric may be of any known construction, including, but not limited to knit, woven, or nonwoven.

Electrically insulating exterior layer or layers 104 may be coated, laminated, stitched, or otherwise applied to the exterior surfaces of the sensor. These layers may be constructed of any materials and in any manner such that the overall flexibility of the sensor remains acceptable. Usually these materials will retain the thin profile that is typical of the capacitive sensors of the invention. Possible materials for the cover layer(s) 104 include textiles, leather or other hides, films, or coatings. There may be exterior layers 104 on either or both the top and bottom of the sensor. The insulating layers may each be a composite of multiple materials and layers, and the top and bottom exterior layers need not be of the same make-up.

Decorative graphics or information, e.g., information about, or instructions for, capacitive sensor 10 or the display or other device to which capacitive sensor 10 is applied or connected, may be printed on an outermost exterior layer 104 on the sensor. Typically the top surface of the capacitive sensor 10, the surface presented to the user, will include graphics to indicate the location and function of each of the detectors. The material can be chosen to provide both decorative and functional aspects. Along with aesthetics, insulating exterior layer(s) 104 may provide protective functions such as resistance to abrasion or punctures, stain repellence, protection from spills and liquids, resistance to ultraviolet degradation, etc. The bottom layer of the capacitive sensor 10 can be made with similar materials to serve functions similar to the top layer, except that decorative or informative graphics are not usually included.

It is intended that the scope of the present invention include all modifications that incorporate its principal design features, and that the scope and limitations of the present invention are to be determined by the scope of the appended claims and their equivalents. It also should be understood, therefore, that the inventive concepts herein described are interchangeable and/or they can be used together in still other permutations of the present invention, and that other modifications and substitutions will be apparent to those skilled in the art from the foregoing description of the preferred embodiments without departing from the spirit or scope of the present invention.

What is claimed is:

1. A flexible capacitive sensor comprising:
    a flexible, resilient dielectric layer having a first and a second side;
    a first conductive layer on the first side of the dielectric layer comprising at least one first conductive element;
    a second conductive layer on the second side of the dielectric layer; wherein the first conductive elements overlap at least partially the second conductive layer; and,
    a capacitance meter electrically connected to the conductive elements, wherein the capacitance meter measures change in capacitance between the first conductive layer and the second conductive layer, and wherein the capacitance meter determines the position of a point of user interaction along the first conductive element of the first conductive layer.

2. The flexible capacitive sensor of claim 1, wherein capacitance meters comprises applying an alternating current that has a frequency greater than 10 KHz to the conductive elements.

3. The flexible capacitive sensor of claim 1, wherein each of the conductive elements each have a resistance of 1 kiloohm or more.

4. The flexible capacitive sensor of claim 3, wherein each of the conductive elements each have a resistance of 1 megaohm or less.

5. The flexible capacitive sensor of claim 1, wherein the capacitance meter determines position in one direction.

6. The flexible capacitive sensor of claim 1, wherein the capacitance meter determines position in at least 2 directions.

7. The flexible capacitive sensor of claim 1, wherein the capacitance meter separately applies voltages to 2 or more distinct locations on the first conductive element or the second conductive layer and determines the position of the user interaction from the values of the signals from each applied voltage.

8. The flexible capacitive sensor of claim 1, wherein the first conductive element has a serpentine shape.

9. The flexible capacitive sensor of claim 8, wherein the first conductive element further comprises a second serpentine shape electrically isolated from the first serpentine shape.

10. The flexible capacitive sensor of claim 1, wherein the first conductive element has a spiral shape.

11. The flexible capacitive sensor of claim 1, wherein the first conductive layer comprises two or more first conductive elements.

12. The flexible capacitive sensor of claim 1, wherein the width of the first conductive element changes over the length of the element.

13. The flexible capacitive sensor of claim 1, wherein the sensor further comprises a second resilient, dielectric layer attached on its first side to the first conductive layer opposite the first dielectric layer and a third conductive layer comprising at least a third conductive element on the second side of the second resilient dielectric layer.

* * * * *